US012805345B2

(12) United States Patent
Ho et al.

(10) Patent No.: US 12,805,345 B2
(45) Date of Patent: Nov. 17, 2026

(54) ELECTRONIC DEVICE

(71) Applicant: Advanced Semiconductor Engineering, Inc., Kaohsiung (TW)

(72) Inventors: Cheng-Yu Ho, Kaohsiung (TW); Hong-Sheng Huang, Kaohsiung (TW); Sheng-Chi Hsieh, Kaohsiung (TW); Shao-En Hsu, Kaohsiung (TW); Huei-Shyong Cho, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 391 days.

(21) Appl. No.: 18/500,933

(22) Filed: Nov. 2, 2023

(65) Prior Publication Data

US 2025/0149457 A1 May 8, 2025

(51) Int. Cl.

| | |
|---|---|
| ***H10W 70/60*** | (2026.01) |
| ***H01P 3/00*** | (2006.01) |
| ***H01Q 1/22*** | (2006.01) |
| ***H10W 90/00*** | (2026.01) |
| *H10W 72/20* | (2026.01) |
| *H10W 74/15* | (2026.01) |

(52) U.S. Cl.

CPC ........... *H10W 70/611* (2026.01); *H01P 3/006* (2013.01); *H01Q 1/2283* (2013.01); *H10W 90/00* (2026.01); *H10W 90/401* (2026.01); *H10W 72/252* (2026.01); *H10W 74/15* (2026.01); *H10W 90/724* (2026.01); *H10W 90/734* (2026.01)

(58) Field of Classification Search

None

See application file for complete search history.

(56) References Cited

U.S. PATENT DOCUMENTS

| | | | | |
|---|---|---|---|---|
| 9,978,688 B2 | 5/2018 | Yen et al. | | |
| 11,387,200 B2 | 7/2022 | Dogiamis et al. | | |
| 11,430,764 B2 | 8/2022 | Cheah et al. | | |
| 2008/0240648 A1* | 10/2008 | Im | G02B 6/43 | 257/E21.511 |
| 2013/0265733 A1* | 10/2013 | Herbsommer | G02B 6/12004 | 361/774 |
| 2014/0154999 A1* | 6/2014 | Rofougaran | H04B 1/40 | 455/73 |
| 2016/0276727 A1* | 9/2016 | Dang | H01P 3/08 | |
| 2016/0336638 A1* | 11/2016 | Dang | H01P 5/107 | |
| 2021/0193616 A1* | 6/2021 | Cheah | H10W 44/20 | |

* cited by examiner

*Primary Examiner* — Bilkis Jahan

(74) *Attorney, Agent, or Firm* — Foley & Lardner LLP

(57) ABSTRACT

The present disclosure relates to an electronic device that includes a first electronic component, a second electronic component, an interconnection structure below the first electronic component and the second electronic component and electrically connecting the first electronic component to the second electronic component, and a first waveguide below the first electronic component and the second electronic component and configured to transmit electromagnetic waves.

17 Claims, 7 Drawing Sheets

ELECTRONIC DEVICE

BACKGROUND

1. Technical Field

The present disclosure generally relates to an electronic device including antennas and multiple electronic components connected by a bridge die.

2. Description of the Related Art

With advances in technology, higher operating frequencies and reduced wireless devices are required. To meet the requirements of high-speed transmission, transceiver portions (such as antennas) may be arrayed on an x-y coordinate plane. In addition, to avoid signal loss under the higher operating frequencies, larger arrays are required to increase transceiver gain of wireless devices. As a result, electronic devices that can better balance signal loss and size are called for.

SUMMARY

In some embodiments, an electronic device that includes a first electronic component, a second electronic component, an interconnection structure below the first electronic component and the second electronic component and electrically connecting the first electronic component to the second electronic component, and a first waveguide below the first electronic component and the second electronic component and configured to transmit electromagnetic waves.

In some embodiments, an electronic device includes a baseband die, a radio-frequency integrated chip (RFIC) beside the baseband die, and a bridge die below the baseband die and the RFIC and electrically connecting a portion of output terminals of the baseband die with a portion of output terminals of the RFIC.

In some embodiments, an electronic device includes a baseband chip, a RFIC adjacent to the baseband chip, and a waveguide disposed below the baseband chip and the RFIC, wherein the waveguide defines an antenna electrically connected to the RFIC.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
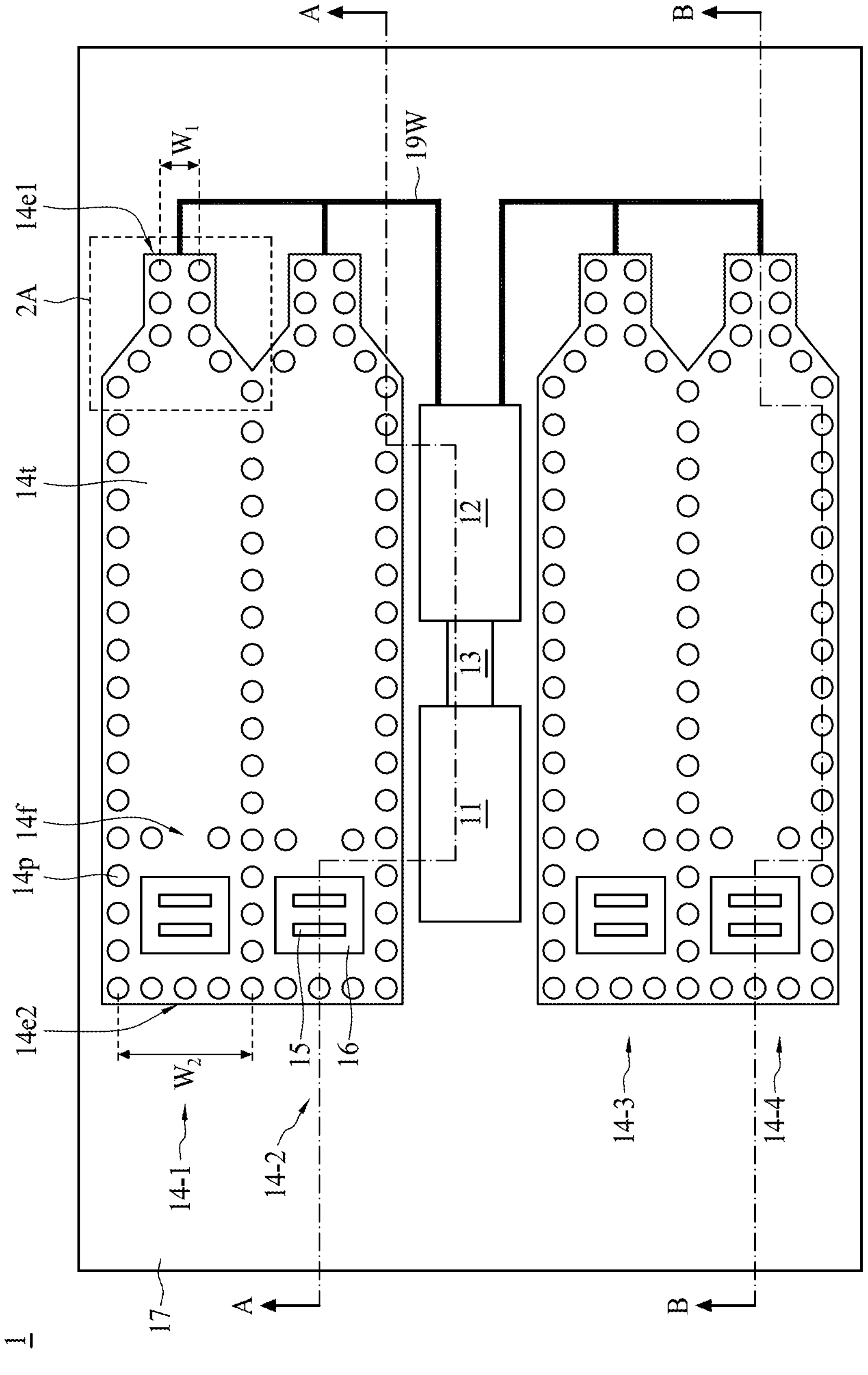
FIG. 1A is a top view of an electronic device, in accordance with some embodiments of the present disclosure.

The following disclosure provides different embodiments, or examples, for implementing different features of the provided subject matter. Specific examples of components and embodiments are recited herein. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. The present disclosure may repeat reference numerals and/or letters in the various examples. This repetition is for simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

FIG. 1A is a top view of an electronic device 1, in accordance with some embodiments of the present disclosure. In some embodiments, the electronic device 1 may include a semiconductor device or a semiconductor device package. In some embodiments, the electronic device 1 may include a wireless transceiver device or a wireless communication device. In some embodiments, the electronic device 1 may be configured to operate with electromagnetic waves or electromagnetic signals at appropriate radio wavelengths, such as microwave, millimeter wave, or submillimeter wave. In some embodiments, the electronic device 1 may be operated with electromagnetic waves or electromagnetic signals at appropriate radio frequencies such as 5G, beyond 5G (B5G), or sub-THz.

Referring to FIG. 1A, the electronic device 1 may include electronic components 11 and 12, an interconnection structure 13, waveguides 14-1, 14-2, 14-3, 14-4, antennas 15 and 16, an encapsulant 17, a transition structure 2A, and a connecting pattern 19*w*. In some embodiments, the encapsulant 17 may cover the interconnection structure 13, waveguides 14-1, 14-2, 14-3, 14-4, antennas 15 and 16, the transition structure 2A, and a connecting pattern 19*w*. For better understanding of the arrangement of the electronic device 1, the encapsulant 17 is depicted as transparent in FIG. 1A to show the elements thereof.

Figure 1B:
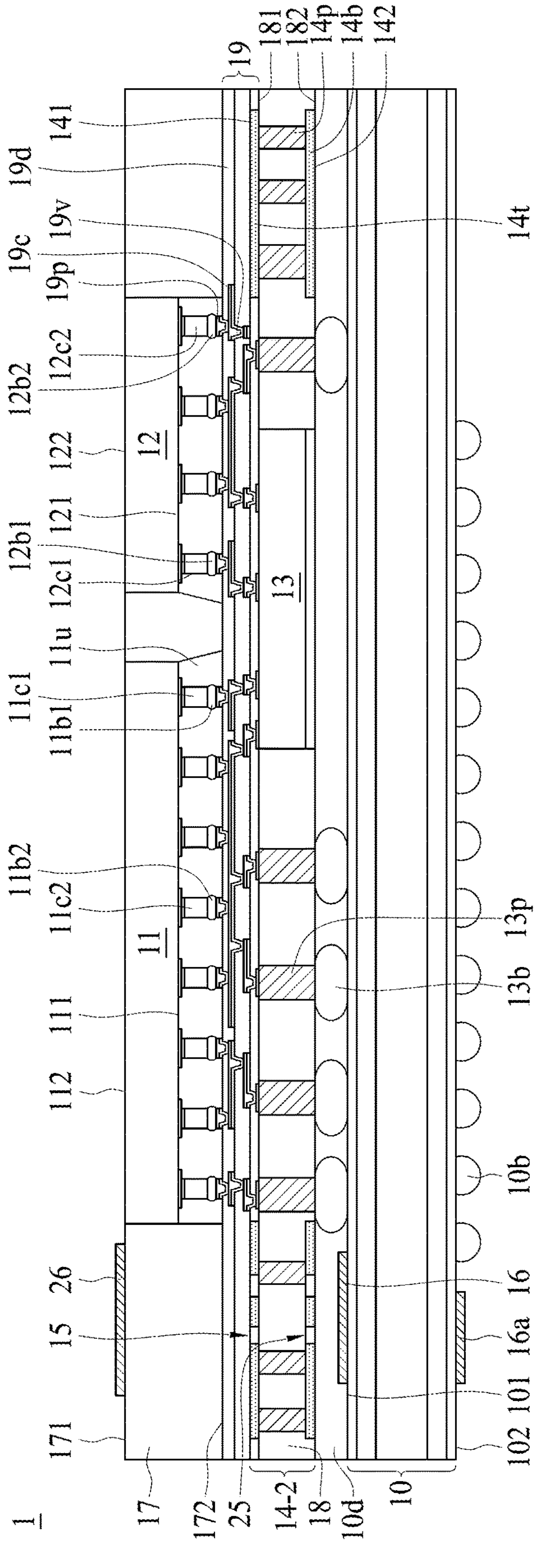
FIG. 1B is a cross-section of an electronic device along line A-A of FIG. 1A, in accordance with some embodiments of the present disclosure.

The electronic component 11 is beside the electronic component 12. In some embodiments, the electronic component 11 is spaced apart from the electronic component 12. The electronic component 11 may be electrically connected to the electronic component 12 through the interconnection structure 13. In some embodiments, the interconnection structure 13 may be partially below the electronic components 11 and 12 (as shown in FIG. 1B). In some embodiments, the interconnection structure 13 can be a bridge die connecting the electronic component 11 to the electronic component 12. In some embodiments, the electronic component 11 can be configured to supply power to the electronic component 12 through the interconnection structure 13.

The electronic component 11 may be configured to modulate a signal from the electronic component 12. In some embodiments, the electronic component 11 may be configured to convert the signal from an analog signal to a digital signal. In some embodiments, the electronic component 11 may include one or more of a baseband die, an analog-to-digital converter (ADC), a digital-to-analog converter (DAC), a filter, a multiplexer, a demultiplexer, a modulator, a demodulator, and so on.

The electronic component 12 may be electrically connected to one or more of the waveguides 14-1, 14-2, 14-3, 14-4 through the connecting pattern 19*w*. In some embodiments, the connecting pattern 19*w* may be a circuit layer. For example, the connecting patter 19*w* may be a redistribution layer (RDL).

In some embodiments, the electronic component 12 may include a power amplifier. In some embodiments, the electronic component 12 may include one or more of a radio frequency integrated circuit (RFIC), an analog-to-digital (A/D) converter, a digital-to-analog (D/A) converter, a filter, a low noise amplifier (LNA), a power amplifier, a multiplexer, a demultiplexer, a modulator, a demodulator, and so on.

The waveguide 14-1 may be disposed at a side of the interconnection structure 13. In some embodiments, the waveguide 14-1 may at least partially surround the interconnection structure 13. In other embodiments, the waveguide 14-1 may locate two sides of the interconnection structure 13. In some embodiments, the waveguide 14-1 can be configured to transmit electromagnetic waves between the electronic component 12 and the antennas 15 and 16. In some embodiments, the waveguide 14-1 may extend beyond a left edge of the electronic component 11. The waveguide 14-1 may extend beyond a right edge the electronic component 12.

In some embodiments, the waveguide 14-1 may include a first end 14*e*1 with a first width W1 and a second end 14*e*2 with a second width W2. The waveguide 14-1 may be connected to the connecting pattern 19*w* at the first end 14*e*1. In some embodiments, the second end 14*e*2 may be coupled with the antenna 15 and/or 16. The first width W1 may be less than the second width W2. For example, the width W2 may have five units of conductive structures 14*p*. The width W1 may have two units of conductive structures 14*p*. In some embodiments, the second width W2 may taper in a direction from the second end 14*e*2 to the first end 14*e*1.

The waveguide 14-1 may receive electromagnetic waves from the antenna 15 or 16 at the second end 14*e*2, and transmit to the first end 14*e*1 and convert the electromagnetic waves to electrical signals, and further transmit the electrical signals to the electronic component 12 through the connecting pattern 19*w*. In another embodiment, the waveguide 14-1 may receive electrical signals (such as radio-frequency (RF) signal) from the electronic component 12 at the first end 14*e*1, radiate electromagnetic waves in response to the electronic signals, and transmit the electromagnetic waves to the second end 14*e*2 and further transmit to the antenna 15 or 16.

The waveguide 14-1 may include a transition structure 2A connecting a coplanar waveguide (CPW) portion and a substrate integrated waveguide (SIW) portion. In some embodiments, the transition structure 2A may be connected to the electronic component 12 through the connecting pattern 19*w*. The transition structure 2A can include a CPW end with the width W1 and a SIW end with the width W2. The transition structure 2A can taper from the SIW end to the CPW end. A detailed description of the transition structure 2A will be discussed in FIGS. 2A-2D.

The waveguide 14-1 may be a substrate integrated waveguide (SIW). In some embodiments, the waveguide 14-1 may include a plurality of conductive structures 14*p*, a top conductive layer 14*t* and a bottom conductive layer 14*b* (shown in FIG. 1B). In some embodiments, the top conductive layer 14*t*, the bottom conductive layer 14*b*, and the conductive structures 14*p* may define the boundary of the waveguide 14-1. The conductive structures 14*p* may connect the top conductive layer 14*t* and the bottom conductive layer 14*b*.

In some embodiments, the conductive structures 14*p* may be spaced from one another by a gap. In some embodiments, the gap may be smaller than the wavelength of electromagnetic waves with which the electronic device 1 is configured to be operated. The conductive structures 14*p* of the waveguide 14-1 can be arranged in a pair of rows. The rows of conductive structures 14*p* may extend horizontally. The pair of rows of conductive structures 14*p* may define a channel for transmitting electromagnetic waves. Some of the conductive structures 14*p* may be arranged in a column connecting the pair of rows at the second end 14*e*2. For example, the column of conductive structures 14*p* may have three conductive structures 14*p*.

The conductive structures 14*p* may be conductive pillars, conductive vias, or other suitable conductive interconnectors. For example, the conductive structures 14*p* may include a copper (Cu) pillar.

In some embodiments, the top conductive layer 14*t* and the bottom conductive layer 14*b* may each include a conductive material such as a metal or metal alloy. Examples of the conductive material include gold (Au), silver (Ag), aluminum (Al), copper (Cu), or an alloy thereof.

In some embodiments, a part of the conductive structures 14*p* may define a filter 14*f*. The filter 14*f* may be disposed between the antennas 15, 16 and the first end 14*e*1. That is, the electromagnetic waves from the first end 14*e*1 may be processed by the filter 14*f* and then transmitted to the antennas 15 and 16. In some embodiments, the filter 14*f* may include one or more conductive structures 14*p* extending from the middle of the rows of conductive structures 14*p*. In some embodiments, the conductive structures 14*p* of the filter 14*f* may be arranged symmetrically. For example, the filter 14*f* may have one conductive structure 14*p* adjacent to each of the rows. In some embodiments, the conductive structures 14*p* of the filter 14*f* can be arranged in column connecting the pair of rows at the middle of the rows, with a space provided in the middle of the column. In some embodiments, the filter 14*f* may be configured to filter the electromagnetic signals carried by the waveguide 14-1 to obtain required frequency range.

In some embodiments, the antenna 15 may be disposed between the second end 14*e*2 of the waveguide 14-1 and the filter 14*f*. The second end 14*e*2 of the waveguide 14-1 may be coupled with the antenna 15. The antenna 15 may be a slot antenna.

The antenna 16 may be disposed between the second end 14*e*2 of the waveguide 14-1 and the filter 14*f*. The second end 14*e*2 of the waveguide 14-1 may be coupled with the antenna 16. The antenna 16 may cover the antenna 15. In some embodiments, the antenna 16 may overlap the antenna 15. The antenna 16 may be coupled with the antenna 15. The antenna 16 may be a patch antenna.

In some embodiments, the waveguide 14-2 may be disposed at a side of the interconnection structure 13. The waveguide 14-2 may be adjacent to the waveguide 14-1. The waveguide 14-2 may be located between the waveguide 14-1 and the interconnection structure 13. In some embodiments, the waveguide 14-2 may include embodiments similar to the waveguide 14-1. The conductive structures 14*p* of the waveguide 14-2 can be arranged in a pair of rows. The rows of conductive structures 14*p* may extend horizontally.

In some embodiments, the waveguides 14-1 and 14-2 may share a part of the plurality of conductive structures 14*p*. In one embodiment, the shared part may be one row of the conductive structures 14*p*. Therefore, the waveguides 14-1 and 14-2 may include three rows of conductive structures 14*p*. In some embodiments, the waveguides 14-1 and 14-2 may share the top conductive layer 14*t* and the bottom conductive layer 14*b*.

The waveguide 14-3 may be disposed at another side of the interconnection structure 13 opposite to the waveguide 14-1. The waveguide 14-3 may be adjacent to the interconnection structure 13. In other words, the interconnection structure 13 may be located between the waveguide 14-1 and the waveguide 14-3. In some embodiments, the waveguides 14-2 and 14-3 may be adjacent to two sides of the interconnection structure 13. That is, the waveguides 14-2 and 14-3 may be adjacent to opposite sides of the interconnection structure 13. In some embodiments, the waveguides may surround the interconnection structure 13. In some embodiments, the waveguide 14-3 may include embodiments similar to the waveguide 14-1. The conductive structures 14*p* of the waveguide 14-3 can be arranged in a pair of rows.

The waveguide 14-4 may be disposed at the side of the interconnection structure 13 opposite to the waveguide 14-1. The waveguide 14-4 may be adjacent to the waveguide 14-3. In some embodiments, the waveguide 14-3 may be located between the waveguide 14-4 and the interconnection structure 13. In some embodiments, the waveguide 14-4 may include arrangements similar to the waveguide 14-1. The conductive structures 14*p* of the waveguide 14-4 can be arranged in a pair of rows.

The arrangement of the waveguides 14-3 and 14-4 is similar to that of the waveguides 14-1 and 14-2. In some embodiments, the waveguides 14-3 and 14-4 may share a part of the plurality of conductive structures 14*p*. In some embodiments, the waveguides 14-3 and 14-4 may share the top conductive layer 14*t* and the bottom conductive layer 14*b*.

In some embodiments, the electronic components 11 and 12 may be disposed between the waveguides 14-2 and 14-3. In other embodiments, a portion of the electronic components 11 and 12 may be disposed directly on the waveguide 14-2 or 14-3. The electronic components 11 and 12 may partially cover one or more of the waveguides 14-1, 14-2, 14-3, and 14-4. In some embodiments, a portion of the electronic components 11 and 12 may overlap the waveguide 14-1, 14-2, 14-3, and 14-4. Accordingly, the space below the electronic components 11 and 12 can be utilized, and thus the electronic device size can be reduced.

In some embodiments, each of the waveguides 14-1, 14-2, 14-3, 14-4 may be a channel for transmitting electromagnetic waves. The electromagnetic waves carried by the waveguides 14-1, 14-2, 14-3, 14-4 may have the same frequency.

FIG. 1B is a cross-section of an electronic device 1 along line A-A of FIG. 1A, in accordance with some embodiments of the present disclosure. In some embodiments, the same or similar elements in FIG. 1A and FIG. 1B are annotated with the same symbols, and are not repeated herein. Referring to FIG. 1B, the electronic device 1 may include a substrate 10, electronic components 11, 12, an interconnection structure 13, a waveguide 14-2, antennas 15, 16, 16*a*, 25, 26, encapsulants 17, 18, a circuit layer 19, and connectors 10*b*, 13*b*.

In some embodiments, the substrate 10 may be multilayered. The substrate 10 may have a top surface 101 and a bottom surface 102 opposite to the surface 101. The substrate 10 may be a printed circuit board (PCB), for example, but is not limited thereto. In some embodiments, one or more connectors 10*b* may be disposed on the bottom surface 102 of the substrate 10. The connectors 10*b* may be configured to connect the electronic device 1 to external components. The connectors 10*b* may be solder bumps. In some embodiments, the connectors 13*b* may include a copper (Cu) pillar. In some embodiments, the connectors 13*b* may include a coaxial connector.

In some embodiments, a dielectric layer 10*d* may be disposed on the top surface 101 of the substrate 10. In some embodiments, a lateral surface of the dielectric layer 10*d* may align with a lateral surface of the substrate 10. The dielectric layer 10*d* may have a width identical to a width of the substrate 10.

The interconnection structure 13 may be disposed on the dielectric layer 10*d*. The dielectric layer 10*d* may be disposed between the interconnection structure 13 and the substrate 10. The interconnection structure 13 may have a lateral surface recessed from a lateral surface of the substrate 10. In some embodiments, the interconnection structure 13 can be a bridge die. For example, the interconnection structure 13 may integrate the connection paths of input/output terminals (I/O), power/ground terminals, and clock.

In some embodiments, the encapsulant 18 may be disposed on the dielectric layer 10*d*. The encapsulant 18 may cover the interconnection structure 13. The encapsulant 18 may encapsulate the interconnection structure 13. In some embodiments, the encapsulant 18 may have a top surface 181 and a bottom surface 182 opposite to the top surface 181 and facing the substrate 10. The top surface of the interconnection structure 13 may be exposed by the encapsulant 18. In some embodiments, the top surface of the interconnection structure 13 may align with the top surface 181 of the encapsulant 18. In some embodiments, the encapsulant 18 may have a lateral surface substantially coplanar to a lateral surface of the substrate 10.

In some embodiments, a plurality of conductive structures 13*p* may be disposed on the dielectric layer 10*d*. The conductive structures 13*p* can be disposed adjacent to the interconnection structure 13. The conductive structures 13*p* may surround the interconnection structure 13. In some embodiments, the conductive structures 13*p* may be spaced from one another by a distance.

The conductive structures 13*p* may be conductive pillars, conductive vias, or other suitable conductive interconnectors. For example, the conductive structures 14*p* may include a copper (Cu) pillar.

In some embodiments, the connectors 13*b* may be disposed under the conductive structures 13*p*. In some embodiments, the connectors 13*b* may correspond to the conductive structures 13*p*. That is, one of the conductive structures 13*p* may be disposed on one of the connectors 13*b*. The conductive structures 13*p* may penetrate the encapsulant 18 and contact the connectors 13*b*. The connectors 13*b* may penetrate the dielectric layer 10*d*. In some embodiments, the connectors 13*b* may be covered by the dielectric layer 10*d*. In some embodiments, the connectors 13*b* may connect the substrate 10 and the conductive structures 13*p*.

In some embodiments, the connectors 13*b* may include a solder ball. In some embodiments, the connectors 13*b* may include a copper (Cu) pillar. In some embodiments, the connectors 13*b* may include a coaxial connector.

The circuit layer 19 may be disposed on the top surface 181 of the encapsulant 18. In some embodiments, the circuit layer 19 may be disposed on the interconnection structure 13. The circuit layer 19 may be a redistribution layer (RDL). In some embodiments, the circuit layer 19 may include one or more dielectric layers 19*d*. The dielectric layers 19*d* are stacked to form a multilayer structure. The dielectric layers 19*d* may have a lateral surface aligned with the lateral surface of the encapsulant 18. In some embodiments, the circuit layer 19 may further include traces 19*c* disposed within the dielectric layers 19*d* or on the topmost dielectric layer 19*d*. In some embodiments, the circuit layer 19 may include conductive vias 19*v* penetrating one or more of the dielectric layers 19*d*, and electrically connected the corresponding traces 19*c*. The circuit layer 19 can include one or more pads 19*p* disposed on the dielectric layer 19*d*. The pads 19*p* can protrude from the top surface of the dielectric layers 19*d*. In another embodiment, the pads 19*p* may be embedded in the dielectric layer 19*d* and the top surface of the pads 19*p* may be exposed by the dielectric layer 19*d*.

The electronic component 11 may be disposed on the top surface 181 of the encapsulant 18. The electronic component 11 may be disposed on the circuit layer 19. In some embodiments, the electronic component 11 may be disposed on the interconnection structure 13. The electronic component 11 may partially overlap the interconnection structure 13 vertically.

The electronic component 11 can have an active surface 111 and a backside surface 112 opposite thereto. The active surface 111 faces the circuit layer 19. In some embodiments, the electronic component 11 can have pads protruding from the active surface 111. In another embodiments, the pads of the electronic component 11 may be embedded within the electronic component 11.

One or more interconnectors 11*c*1, 11*c*2 may be disposed on the pads of the electronic component 11. The interconnectors 11*c*1, 11*c*2 may be disposed on the active surface 111 of the electronic component 11. In some embodiments, the interconnectors 11*c*1, 11*c*2 may include a conductive pillar. In some embodiments, the interconnectors 11*c*1, 11*c*2 may include a copper (Cu) pillar. In some embodiments, the interconnectors 11*c*1, 11*c*2 may include a coaxial connector.

One or more connectors 11*b*1, 11*b*2 may be disposed on the interconnectors 11*c*1, 11*c*2 of the electronic component 11. In some embodiments, the connectors 11*b*1, 11*b*2 may include a solder ball. In some embodiments, the connectors 11*b*1, 11*b*2 may include a copper (Cu) pillar. In some embodiments, the connectors 11*b*1, 11*b*2 may include a coaxial connector.

In some embodiments, the interconnectors 11*cl* and/or connectors 11*b*1 may define an output terminal of the electronic component 11. The interconnectors 11*cl* and the connectors 11*b*1 may electrically connect the electronic component 11 to the interconnection structure 13 through the circuit layer 19.

The interconnectors 11*c*2 and/or connectors 11*b*2 may define an output terminal of the electronic component 11. The interconnectors 11*c*2 and the connectors 11*b*2 may electrically connect the electronic component 11 to external components through the circuit layer 19. In some embodiments, the interconnectors 11*c*2 and the connectors 11*b*2 may be electrically connected to the conductive structures 13*p* through the circuit layer 19. In some embodiments, the conductive path connecting the electronic component 11 to external components may pass through the interconnectors 11*c*2, connectors 11*b*2, the circuit layer 19, the conductive structures 13*p*, the connectors 13*b*, the substrate 10, and the connectors 10*b*.

The electronic component 11 may be larger than the interconnection structure 13, for example, wider or thicker. In other embodiments, the thickness of the electronic component 11 and interconnection structure 13 may be the same. In some embodiments, the electronic component 11 may be a baseband die.

In some embodiments, the underfill 11*u* may encapsulate the interconnectors 11*c*1, 11*c*2 and connectors 11*b*1, 11*b*2. In some embodiments, the underfill 11*u* may be disposed between the electronic component 11 and the circuit layer 19. The underfill 11*u* may cover a part of the dielectric layer 19*d*. The underfill 11*u* may partially cover a lateral surface of the electronic component 11. The underfill 11*u* is free from contact with the backside surface 112 of the electronic component 11. The underfill 11*u* may expose the backside surface 112 of the electronic component 11. The underfill 11*u* may have a lateral surface not perpendicular to the backside surface 112 of the electronic component 11. In some embodiments, the underfill 11*u* may have an upper width adjacent to the active surface 111 of the electronic component 11 and a lower width adjacent to the circuit layer 19. The upper width of the underfill 11*u* may be identical to the lower width of the underfill 11*u*. In another embodiment, the upper width of the underfill 11*u* may be different from the lower width of the underfill 11*u*. For example, the upper width of the underfill 11*u* may be less than the lower width of the underfill 11*u*.

Referring to FIG. 1B, the electronic component 12 may be disposed on the top surface 181 of the encapsulant 18. The electronic component 12 may be disposed on the circuit layer 19. In some embodiments, the electronic component 12 may be disposed adjacent to the electronic component 11. The electronic component 12 may be spaced apart from the electronic component 11. In some embodiments, the electronic component 12 may be disposed on the interconnection structure 13. The electronic component 12 may partially overlap the interconnection structure 13 vertically.

In some embodiments, the interconnection structure 13 may be below and electrically connect the electronic component 11 and electronic component 12.

The electronic component 12 can have an active surface 121 and a backside surface 122 opposite to the active surface 121. The active surface 121 faces the circuit layer 19. In some embodiments, the electronic component 12 can have pads protruding from the active surface 121. In another embodiment, the pads of the electronic component 12 may be embedded within the electronic component 12.

One or more interconnectors 12*c*1, 12*c*2 may be disposed on the pads of the electronic component 12. The interconnectors 12*c*1, 12*c*2 may be disposed on the active surface 121 of the electronic component 12. In some embodiments, the interconnectors 12c1, 12c2 may include a conductive pillar. In some embodiments, the interconnectors 12c1, 12c2 may include a copper (Cu) pillar. In some embodiments, the interconnectors 12c1, 12c2 may include a coaxial connector.

One or more connectors 12b1, 12b2 may be disposed on the interconnectors 12c1, 12c2 of the electronic component 12. In some embodiments, the connectors 12b1, 12b2 may include a solder ball. In some embodiments, the connectors 12b1, 12b2 may include a copper (Cu) pillar. In some embodiments, the connectors 12b1, 12b2 may include a coaxial connector.

In some embodiments, the interconnectors 12cl and/or connectors 12b1 may define an output terminal of the electronic component 12. The interconnectors 12cl and the connectors 12b1 may electrically connect the electronic component 12 to the interconnection structure 13 through the circuit layer 19. In some embodiments, the interconnection structure 13 may electrically connect a portion of the output terminal (such as the interconnectors 11cl and/or connectors 11b1) of the electronic component 11 to a portion of the output terminals (such as the interconnectors 12cl and/or connectors 12b1) of the electronic component 12.

The interconnectors 12c2 and/or connectors 12b2 may define an output terminal of the electronic component 12. The interconnectors 12c2 and the connectors 12b2 may electrically connect the electronic component 12 to external components through the circuit layer 19. In some embodiments, the interconnectors 12c2 and the connectors 12b2 may be electrically connected to the conductive structures 13p through the circuit layer 19. In some embodiments, the conductive path connecting the electronic component 12 to external components may pass through the interconnectors 12c2, connectors 12b2, the circuit layer 19, the conductive structures 13p, the connectors 13b, the substrate 10, and the connectors 10b.

In some embodiments, a portion of the output terminal (such as the interconnectors 11c2 and/or connectors 11b2) of the electronic component 11 and a portion of the output terminals (such as the interconnectors 12c2 and/or connectors 12b2) of the electronic component 12 may be configured to electrically connect to external components without the interconnection structure 13.

Electronic component 12 may be larger than interconnection structure 13, for example, wider. In another embodiment, the width of the electronic component 12 may be the same as that of the interconnection structure 13. In some embodiments, the thickness of the electronic component 12 may be greater than that of the interconnection structure 13. In other embodiments, the thickness of the electronic component 12 and the thickness of the interconnection structure 13 may be the same. In some embodiments, the electronic component 12 may be an RFIC.

Electronic component 11 may be larger than electronic component 12, for example, wider. In another embodiment, the width of the electronic component 11 may be the same as that of the electronic component 12. In some embodiments, the thickness of the electronic component 11 and the thickness of the electronic component 12 may be the same.

In some embodiments, the underfill 12u may encapsulate the interconnectors 12c1, 12c2 and connectors 12b1, 12b2. In some embodiments, the underfill 12u may be disposed between the electronic component 12 and the circuit layer 19. The underfill 12u may cover a part of the dielectric layer 19d. The underfill 12u may partially cover a lateral surface of the electronic component 12. The underfill 12u is free from contact with the backside surface 122 of the electronic component 12. The underfill 12u may expose the backside surface 122 of the electronic component 12. The underfill 12u may have a lateral surface non-perpendicular to the backside surface 122 of the electronic component 12. In some embodiments, the underfill 12u may have an upper width adjacent to the active surface 121 of the electronic component 12 and a lower width adjacent to the circuit layer 19. The upper width of the underfill 12u may be identical to the lower width of the underfill 12u. In another embodiment, the upper width of the underfill 12u may be different from the lower width of the underfill 12u. For example, the upper width of the underfill 12u may be less than the lower width of the underfill 12u.

The underfill 12u may be separated from the underfill 11u. The underfill 12u may be free from contacting the underfill 11u. In some embodiments, a portion of the circuit layer 19 between the electronic components 11 and 12 may be exposed by the underfills 11u and 12u.

In some embodiments, the encapsulant 17 may be disposed on circuit layer 19. The encapsulant 17 may cover the electronic component 11 and the electronic component 12. The encapsulant 17 may have a top surface 171 and a bottom surface 172 opposite to the top surface 171 and facing the substrate 10. The encapsulant 17 may encapsulate the electronic component 11 and the electronic component 12. In some embodiments, the encapsulant 17 may cover a lateral surface of the electronic component 11. The encapsulant 17 may cover a lateral surface of the electronic component 12. The top surface of the electronic component 11 and the electronic component 12 may be exposed by the encapsulant 17. In some embodiments, the top surface of the electronic component 11 may align with the top surface 171 of the encapsulant 17. The top surface of the electronic component 12 may align with the top surface 171 of the encapsulant 17. In some embodiments, the encapsulant 17 may have a lateral surface substantially coplanar to a lateral surface of the circuit layer 19. The encapsulant 17 may cover the underfill 11u and underfill 12u. In some embodiments, the encapsulant 17 may fill in the space between the underfill 11u and the underfill 12u.

The waveguide 14-2 may be disposed on the top surface 101 of the substrate 10. That is, the top surface 101 of the substrate 10 may face the waveguide 14-2. The waveguide 14-2 may be disposed below the electronic component 11 and the electronic component 12. In some embodiments, the waveguide 14-2 may be locate at an elevation substantially identical to the interconnection structure 13. The waveguide 14-2 and the interconnection structure 13 may be formed in the same layer. In some embodiments, a thickness of the waveguide 14-2 may be substantially identical to that of the interconnection structure 13.

In some embodiments, the waveguide 14-2 may have a top surface 141 and a bottom surface 142 opposite to the top surface 141. The bottom surface 142 of the waveguide 14-2 may be substantially coplanar to the bottom surface 182 of the encapsulant 18. The top surface 141 of the waveguide 14-2 may be higher than the interconnection structure 13 with respect to the substrate 10.

The waveguide 14-2 may include a top conductive layer 14t, a bottom conductive layer 14b, and a plurality of conductive structures 14p. In some embodiments, the top conductive layer 14t, the bottom conductive layer 14b, and the conductive structures 14p may define the boundary of the waveguide 14-2.

The bottom conductive layer 14b may be disposed on the dielectric layer 10d. The bottom conductive layer 14b may be covered by the encapsulant 18. In some embodiments, the bottom surface 182 of the encapsulant 18 may be substantially coplanar to the bottom surface of the bottom conductive layer 14*b*. The top conductive layer 14*t* may be disposed on the top surface 181 of the encapsulant 18. In some embodiments, the top conductive layer 14*t* may be covered by the dielectric layer 19*d* of the circuit layer 19. In some embodiments, a lateral surface of the top conductive layer 14*t* may be substantially coplanar to a lateral surface of the bottom conductive layer 14*b*.

In some embodiments, the conductive structures 14*p* may be disposed between the top conductive layer 14*t* and the bottom conductive layer 14*b*. The conductive structures 14*p* may be covered by the encapsulant 18. The conductive structures 14*p* may penetrate the encapsulant 18 and contact the bottom conductive layer 14*b*. The conductive structures 14*p* may connect the top conductive layer 14*t* and the bottom conductive layer 14*b*. In some embodiments, the conductive structures 14*p* may be separated by a gap. In one embodiment, adjacent conductive structures 14*p* may be separated by the same distance. That is, the conductive structures 14*p* may have the same pitch. The conductive structures 14*p* may define a channel for transmitting electromagnetic waves. In some embodiments, the waveguide 14-2 may be defined by the encapsulant 18.

In some embodiments, the top conductive layer 14*t* may electrically connect to the electronic component 12 through the circuit layer 19 (i.e., the connecting pattern 19*w* shown in FIG. 1A). In such a case, the waveguide 14-2 may receive electromagnetic signals from the electronic component 12 or transmit electromagnetic signals to the electronic component 12 through the circuit layer 19.

The antenna 15 may be disposed on the top surface 141 of the waveguide 14-2. The antenna 15 may be located within the top conductive layer 14*t*. The antenna 15 may be a slot antenna. In some embodiments, the antenna 15 may include one or more slots. In other words, the top conductive layer 14*t* may include one or more slots to form the slot antenna 15. In some embodiments, the antenna 15 may be disposed on the interconnection structure 13. The antenna 15 may be covered by the dielectric layer 19*d* of the circuit layer 19. In some embodiments, the antenna 15 may be embedded in the dielectric layer 19*d* of the circuit layer 19. The dielectric layer 19*d* of the circuit layer 19 may fill in the slots of the antenna 15. In some embodiments, the antenna 15 may be electrically coupled to the waveguide 14-2. The waveguide 14-2 may be configured to transmit the signals (such as electrical signals and electromagnetic waves) between the electronic component 12 and the antenna 15.

The antenna 16 may be disposed on the top surface 101 of the substrate 10. The antenna 16 may be disposed on the bottom surface 142 of the waveguide 14-2 and electrically coupled to the waveguide 14-2. The antenna 16 may be disposed on the bottom conductive layer 14*b*. The antenna 16 may be disposed below the interconnection structure 13. In some embodiments, the antenna 16 may be covered by the dielectric layer 10*d*. In some embodiments, the antenna 16 may be embedded in the dielectric layer 10*d*. In some embodiments, the antenna 16 may be a patch antenna. The waveguide 14-2 may be configured to transmit the signals (such as electrical signals and electromagnetic waves) between the electronic component 12 and the antenna 16. In some embodiments, the antenna 16 may overlap the antenna 15 vertically. The antenna 16 may be electrically coupled to the antenna 15. In some embodiments, the antenna 15 may be a slot antenna and the antenna 16 may be a patch antenna. In such a case, the antenna 16 may increase the radiating bandwidth of the electronic device 1.

In some embodiments, the antenna 16*a* may be disposed on the bottom surface 102 of the substrate 10. In some embodiments, the antenna 16*a* may protrude from the substrate 10. The antenna 16*a* may be disposed on the bottom surface 142 of the waveguide 14-2 and electrically coupled to the waveguide 14-2. The antenna 16*a* may be disposed below the interconnection structure 13. In some embodiments, the antenna 16*a* may be a slot antenna or a patch antenna. The waveguide 14-2 may be configured to transmit the signals (such as electrical signals and electromagnetic waves) between the electronic component 12 and the antenna 16*a*. In some embodiments, the antenna 16*a* may overlap the antennas 15 and 16 vertically. The antenna 16*a* may be electrically coupled to the antenna 16. In some embodiments, the antenna 15 may be electrically coupled to the antenna 16*a* through the antenna 16.

The antenna 25 may be disposed on the bottom surface 142 of the waveguide 14-2 and electrically coupled to the waveguide 14-2. The antenna 25 may be located within the bottom conductive layer 14*b*. The antenna 25 may be a slot antenna. In some embodiments, antenna 25 may include one or more slots. In other words, the bottom conductive layer 14*b* may include one or more slots to form the slot antenna 25. The antenna 25 may be disposed below the interconnection structure 13. In some embodiments, the antenna 25 may be covered by the dielectric layer 10*d*. In one embodiment, the antenna 25 may be embedded in the dielectric layer 10*d*. The dielectric layer 10*d* may fill in the slots of the antenna 25. In some embodiments, the top surface of the antenna 25 may be exposed by the dielectric layer 10*d*. The antenna 25 and the antenna 16 may be separated by the dielectric layer 10*d*. The waveguide 14-2 may be configured to transmit the signals (such as electrical signals and electromagnetic waves) between the electronic component 12 and the antenna 25. In some embodiments, the antenna 25 may overlap the antenna 15 vertically. The antenna 25 may be electrically coupled to the antenna 15. In some embodiments, the antenna 25 may overlap the antenna 16 vertically. The antenna 25 may be electrically coupled to the antenna 16.

The antenna 26 may be disposed on the top surface 171 of the encapsulant 17. The antenna 26 may be disposed on the top surface 141 of the waveguide 14-2 and electrically coupled to the waveguide 14-2. The antenna 26 may be disposed on the interconnection structure 13. In some embodiments, the antenna 26 may be exposed by the encapsulant 17. The antenna 26 may protrude from the encapsulant 17. In some embodiments, the antenna 26 may be a slot antenna or a patch antenna. The waveguide 14-2 may be configured to transmit the signals (such as electrical signals and electromagnetic waves) between the electronic component 12 and the antenna 26. In some embodiments, the antenna 26 may overlap the antenna 15 vertically. The antenna 26 may be electrically coupled to the antenna 15. In some embodiments, the antenna 26 may overlap the antenna 25 vertically. The antenna 26 may be electrically coupled to the antenna 25.

In some embodiments, the electronic device 1 may include one or more of antennas 15, 16, 16*a*, 25, and 26. In one embodiment, the electronic device 1 may merely include antennas 15 and 16. In some embodiments, the electronic device 1 may include antennas 15, 16, and 16*a*. In some embodiments, the electronic device 1 may include antennas 15, 16, 16*a*, 25, and 26.

The interconnection structure (such as bridge die) may integrate the connection paths of input/output terminals (I/O), power/ground terminals, and clock between the baseband and the RFIC. Therefore, the electronic device size can be reduced. Integrating the baseband die and RFIC with bridge die may reduce the transmission path, and thus the signal loss can be reduced. In addition, since the antenna array may be increased to obtain higher gain for high frequency, the integration of baseband die, RFIC, and the antenna array can better utilize the space and the semiconductor package size can be decreased.

Figure 1C:
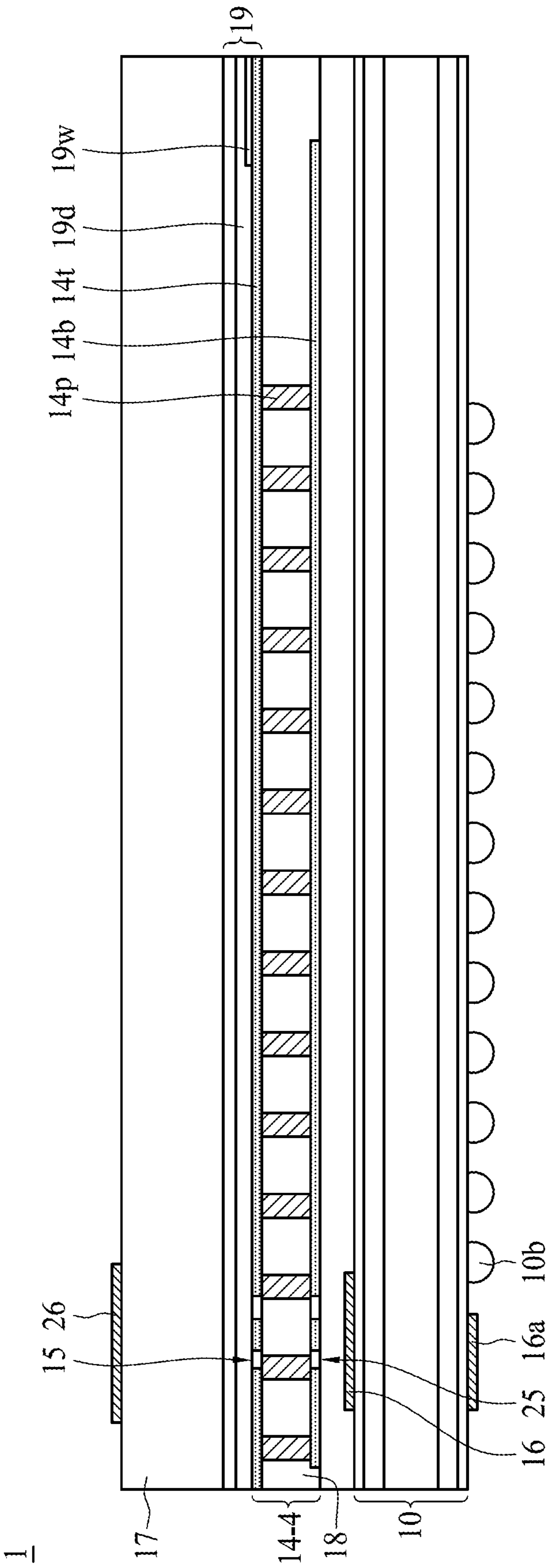
FIG. 1C is a cross-section of an electronic device along line B-B of FIG. 1A, in accordance with some embodiments of the present disclosure.

FIG. 1C is a cross-section of an electronic device 1 along line B-B of FIG. 1A, in accordance with some embodiments of the present disclosure. In some embodiments, the same or similar elements in FIG. 1A, FIG. 1B, and FIG. 1C are annotated with the same symbols, and are not repeated herein. Referring to FIG. 1C, the electronic device 1 may include a substrate 10, a waveguide 14-4, antennas 15, 16, 16*a*, 25, 26, encapsulants 17, 18, a circuit layer 19, and connectors 10*b*.

FIG. 1C shows the cross-section of the entire waveguide 14-4. Referring to FIG. 1C, the circuit layer 19 of the electronic device 1 may include the connecting pattern 19*w* disposed on the top conductive layer 14*t*. The connecting pattern 19*w* may include one or more traces to electrically connect the electronic component 12 to the waveguide 14-4. In some embodiments, the top conductive layer 14*t* may be electrically connected to the electronic component 12 through the connecting pattern 19*w*. In such a case, the waveguide 14-4 may receive electrical signals from the electronic component 12 or transmit electrical signals to the electronic component 12 through the circuit layer 19.

Figure 2A:
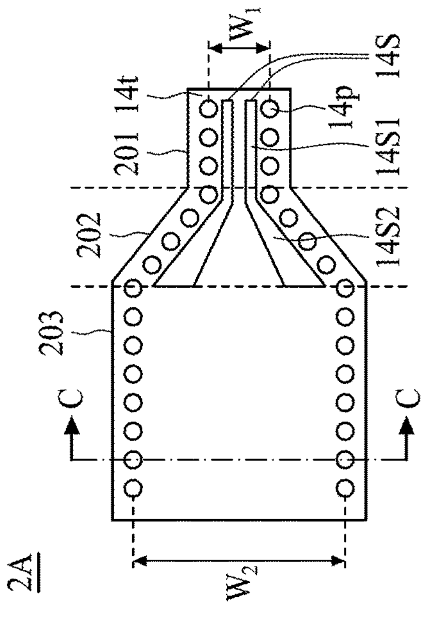
FIG. 2A is a top view of a top conductive layer of a transition structure, in accordance with some embodiments of the present disclosure.
Figure 2B:
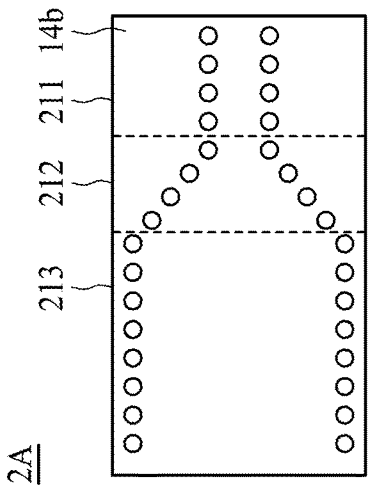
FIG. 2B is a top view of a bottom conductive layer of a transition structure, in accordance with some embodiments of the present disclosure.
Figure 2C:
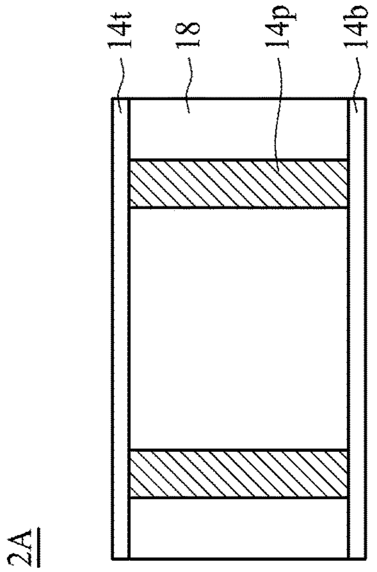
FIG. 2C is a cross-section of a transition structure of an electronic device along line C-C of FIG. 2A, in accordance with some embodiments of the present disclosure.

FIG. 2A is a top view of a top conductive layer 14*t* of a transition structure 2A in accordance with some embodiments of the present disclosure. FIG. 2B is a top view of a bottom conductive layer 14*b* of a transition structure 2A in accordance with some embodiments of the present disclosure. FIG. 2C is a cross-section of a transition structure 2A of an electronic device along line C-C of FIG. 2A, in accordance with some embodiments of the present disclosure.

Referring to FIG. 2A, the top conductive layer 14*t* of the transition structure 2A may include a CPW portion 201, a transition portion, 202, and a SIW portion 203. The CPW portion 201 may be connected to the electronic component 12 through the connecting pattern 19*w* (as shown in FIG. 1A). In some embodiments, the CPW portion 201 may be rectangular having a width W1. The CPW portion 201 may include two rows of conductive structures 14*p* extending along the boundary thereof. In some embodiments, two rows of conductive structures 14*p* of the CPW portion 201 may extend horizontally. In some embodiments, the conductive structures 14*p* may be a SIW structure. The CPW portion 201 may include a pair of slots 14*s*. In some embodiments, the slots 14*s* may include a straight portion 14*s*1 at the CPW portion 201 and a triangular tapered portion 14*s*2 at the transition portion 202. In some embodiments, the slots 14*s* may be a CPW structure.

The transition portion 202 may be disposed between the CPW portion 201 and the SIW portion 203. The transition portion 202 may connect the CPW portion 201 and the SIW portion 203. In some embodiments, the width of the transition portion 202 may taper toward the CPW portion 201. For example, the transition portion 202 may be trapezoidal. The transition portion 202 may include two rows of conductive structures 14*p* extending along the boundary thereof. The transition portion 202 may include a pair of slots 14*s*. In some embodiments, the slots 14*s* and the conductive structures 14*p* in the CPW portion 201 and the transition portion 202 may be configured to transform signals carried by the CPW to signals carried by SIW.

The SIW portion 203 may be adjacent to the transition portion 202. The SIW portion 203 may be rectangular having a width W2. In some embodiments, the width W2 may be greater than the width W1. The SIW portion 203 may include two rows of conductive structures 14*p* extending along the boundary thereof. In some embodiments, two rows of conductive structures 14*p* of the SIW portion 203 may extend horizontally. The SIW portion 203 may be coupled to other conductive structures 14*p* of the waveguide so as to transmit electromagnetic signals between the electronic component 12 and the antennas 15 and 16 (as shown in FIG. 1A).

Referring to FIG. 2B, the bottom conductive layer 14*b* of the transition structure 2A may include portions 211, 212, and 213. In some embodiments, the shape of the bottom conductive layer 14*b* may be different from that of the top conductive layer 14*t*. The bottom conductive layer 14*b* of the transition structure 2A may be rectangular having the width W2. In another embodiment, the shape of the bottom conductive layer 14*b* of the transition structure 2A may conform to the top conductive layer 14*t* (not shown).

In some embodiments, the portion 211 of the bottom conductive layer 14*b* may correspond to the CPW portion 201 of the top conductive layer 14*t*. The conductive structures 14*p* may connect the portion 211 of the bottom conductive layer 14*b* to the CPW portion 201 of the top conductive layer 14*t*. Therefore, the conductive structures 14*p* in the portion 211 may be arranged the same as those in the CPW portion 201.

In some embodiments, the portion 212 of the bottom conductive layer 14*b* may correspond to the transition portion 202 of the top conductive layer 14*t*. The conductive structures 14*p* may connect the portion 212 of the bottom conductive layer 14*b* to the transition portion 202 of the top conductive layer 14*t*. Therefore, the conductive structures 14*p* in the portion 212 may be arranged the same as those in the transition portion 202.

In some embodiments, the portion 213 of the bottom conductive layer 14*b* may correspond to the SIW portion 203 of the top conductive layer 14*t*. The conductive structures 14*p* may connect the portion 213 of the bottom conductive layer 14*b* to the SIW portion 203 of the top conductive layer 14*t*. Therefore, the conductive structures 14*p* in the portion 213 may be arranged the same as those in the SIW portion 203.

Referring to FIG. 2C, the transition structure 2A may include the top conductive layer 14*t*, the bottom conductive layer 14*b*, a pair of rows of conductive structures 14*p*, and the encapsulant 18. In some embodiments, the conductive structures 14*p* may be disposed between the top conductive layer 14*t* and the bottom conductive layer 14*b*. The conductive structures 14*p* may penetrate the encapsulant 18. The pair of rows of conductive structures 14*p* may define a channel for transmitting electromagnetic waves.

Figure 2D:
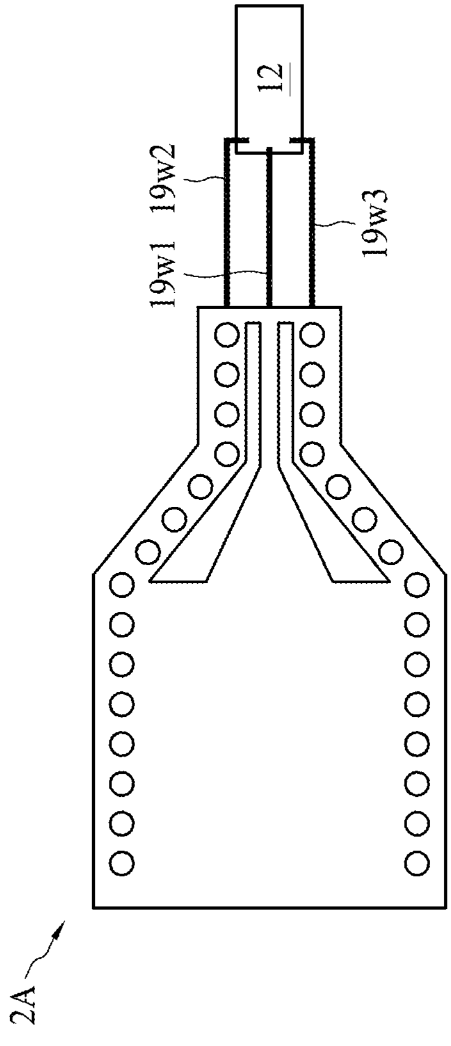
FIG. 2D is a schematic diagram of a transition structure of an electronic device, in accordance with some embodiments of the present disclosure.

FIG. 2D is a schematic diagram of a transition structure 2A of an electronic device, in accordance with some embodiments of the present disclosure. Referring to FIG. 2D, the transition structure 2A may be connected to the electronic component 12 through one or more connecting structures 19*w*1, 19*w*2, and 19*w*3. In some embodiments, the connecting structure 19*w*1 may connect the electronic component 12 and the transition structure 2A (i.e., the waveguide). The connecting structure 19*w*1 may be configured to transmit the electrical signals (such as RF signals) carrying data. The connecting structures 19*w*2 and 19*w*3 may be configured to be ground. Having the connecting structures 19*w*1, 19*w*2, and 19*w*3, the electronic component 12 may transmit the electrical signals to the transition structure 2A and the electrical signals may be carried by the CPW structure of the transition structure 2A. In some embodiments, the CPW structure of the transition structure 2A may radiate the electromagnetic signals in response to the electrical signals. The electromagnetic signals may be coupled from the CPW structure to the SIW structure of the transition structure 2A.

Figure 3:
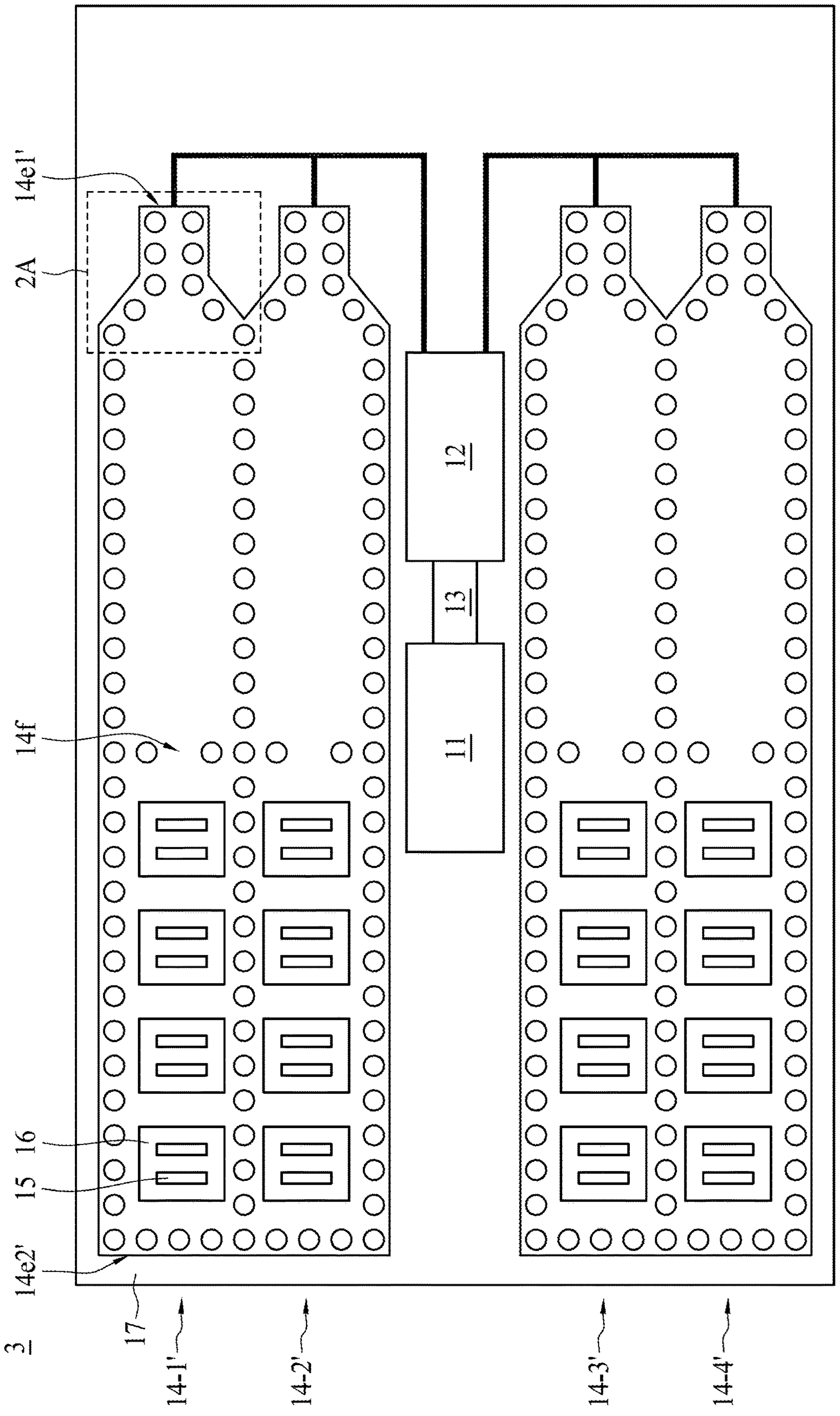
FIG. 3 is a top view of an electronic device, in accordance with some embodiments of the present disclosure.

FIG. 3 is a top view of an electronic device 3, in accordance with some embodiments of the present disclosure. The electronic device 3 of FIG. 3 differs from the electronic device 1 of FIG. 1A in its inclusion of waveguides 14-1', 14-2', 14-3', and 14-4' having lengths different from those of waveguides 14-1, 14-2, 14-3, and 14-4 shown in FIG. 1A. In some embodiments, the length of waveguides 14-1', 14-2', 14-3', and 14-4' may be greater than that of waveguides 14-1, 14-2, 14-3, and 14-4 shown in FIG. 1A. In some embodiments, the electronic device 3 may include an array of antennas 15 and/or antennas 16 disposed on the waveguides 14-1', 14-2', 14-3', and 14-4'.

In some embodiments, one or more antennas 15 may be disposed on the waveguides 14-1'. In some embodiments, the array of antennas 15 may be disposed on the same layer (in cross-section). Each of the antennas 15 on the waveguide 14-1' may be electrically coupled to the waveguide 14-1'. The one or more antennas 15 may be arranged in an array. In some embodiments, the antennas 15 may be arranged in a row. For example, four antennas 15 may be arrayed in a row and disposed on the waveguide 14-1'. In some embodiments, the antennas 15 may be separated by a gap. In some embodiments, the antennas 15 may be disposed between an end 34*e* of the waveguide 14-1' and the filter 14*f*. The end 34*e* of the waveguide 14-1' is distal to the transition structure 2A. In some embodiments, the antennas 15 may be slot antennas. In some embodiments, the same row of antennas 15 may be under the same phase.

In some embodiments, one or more antennas 16 may be disposed on the waveguides 14-1'. In some embodiments, the array of antennas 16 may be disposed on the same layer (in cross-section). Each of the antennas 16 on the waveguide 14-1' may be electrically coupled with the waveguide 14-1'. The one or more antennas 16 may be arrayed, in some embodiments, in a row. For example, four antennas 16 may be arranged in a row and disposed on the waveguide 14-1'. In some embodiments, the antennas 16 may be separated by a gap. In some embodiments, the antennas 16 may be disposed between the end 34*e* of the waveguide 14-1' and the filter 14*f*. In some embodiments, the antennas 16 may be patch antennas. In some embodiments, the same row of antennas 16 may be under the same phase.

The antennas 16 may overlap the antennas 15. The antennas 16 may be electrically coupled with the antennas 15. In some embodiments, the waveguides 14-2', 14-3', and 14-4' may include antennas 15 and/or 16 arranged in a manner similar to the waveguide 14-1'. With more antennas 15 and/or 16 included in the electronic device 3, gain may be improved.

Figure 4:
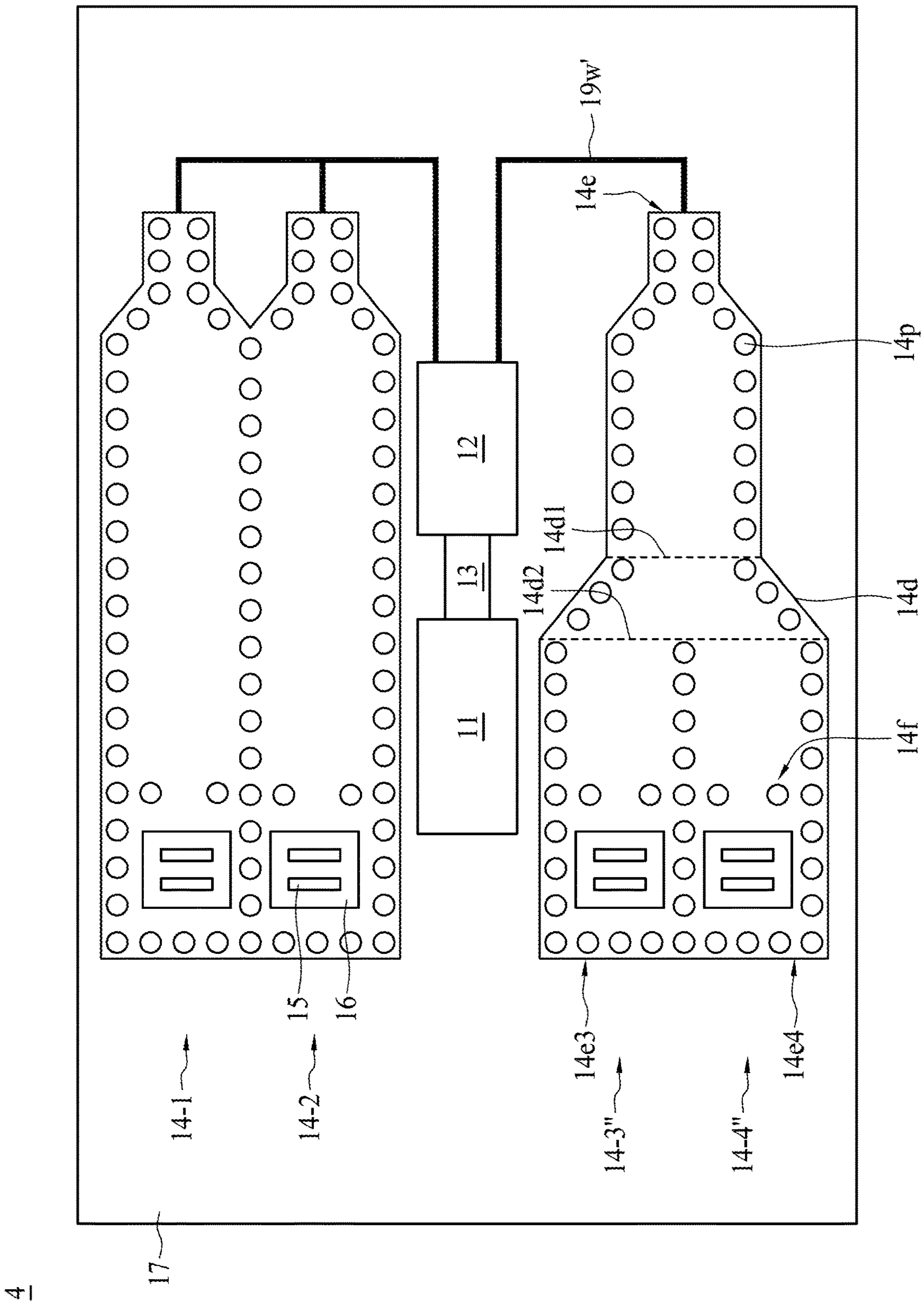
FIG. 4 is a top view of an electronic device, in accordance with some embodiments of the present disclosure.

FIG. 4 is a top view of an electronic device 4, in accordance with some embodiments of the present disclosure, differing from device 1 of FIG. 1A in its inclusion of waveguides 14-3" and 14-4" including a divider 14*d*. Referring to FIG. 4, the waveguides 14-3" and 14-4" may be a one-to-two waveguide by using the divider 14*d*.

The waveguides 14-3" and 14-4" may include a shared end 14*e* connected to the electronic component 12 through the connecting pattern 19*w*'. In some embodiments, the waveguide 14-3" may be connected to the connecting pattern 19*w*' at the shared end 14*e*. The waveguide 14-4" may also be connected to the connecting pattern 19*w*' at the shared end 14*e*. The waveguide 14-3" may include an end 14*e*3 opposite to the shared end 14*e*. The waveguide 14-4" may include an end 14*e*4 opposite to the shared end 14*e*.

The divider 14*d* may be disposed between the shared end 14*e* and the end 14*e*3. The divider 14*d* may be disposed between the shared end 14*e* and the end 14*e*4. The width of the divider 14*d* may taper toward the shared end 14*e*. For example, the divider 14*d* may be trapezoidal. In some embodiments, the divider 14*d* may be defined by a part of the conductive structures 14*p*. The divider 14*d* may include two rows of conductive structures 14*p* extending along the boundary thereof. The divider 14*d* may be configured to divide a channel into two channel for transmitting electromagnetic waves.

In some embodiments, the divider 14*d* may include an end 14*d*1 and an end 14*d*2 opposite to the end 14*d*1. The end 14*d*1 of the divider 14*d* may be connected to two rows of conductive structures 14*p*, such that electromagnetic waves may be received from or transmitted to the shared end 14*e*. The end 14*d*2 of the divider 14*d* may be connected to three rows of conductive structures 14*p*, such that electromagnetic waves may be received from or transmitted to the end 14*e*3 of the waveguide 14-3" and the end 14*e*4 of the waveguide 14-4".

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
- a first electronic component;
- a second electronic component;
- an interconnection structure below the first electronic component and the second electronic component, and electrically connecting the first electronic component to the second electronic component;
- a first waveguide below the first electronic component and the second electronic component, and configured to transmit electromagnetic waves, wherein the first waveguide includes a plurality of conductive structures; and
- an encapsulant covering the plurality of conductive structures.

2. The electronic device of claim 1, wherein the first waveguide is configured to transmit signals between the second electronic component and an antenna.

3. The electronic device of claim 1, wherein the first electronic component is configured to modulate a signal from the second electronic component.

4. The electronic device of claim 3, wherein the first electronic component is configured to convert the signal from an analog signal to a digital signal.

5. The electronic device of claim 1, wherein the second electronic component includes a power amplify element.

6. The electronic device of claim 1, wherein the plurality of conductive structures include conductive pillars separated from each other.

7. The electronic device of claim 1, wherein the plurality of conductive structures are configured to define a channel for transmitting the electromagnetic waves.

8. The electronic device of claim 1, wherein the first waveguide comprises:
- a first conductive layer disposed on a first surface of the encapsulant; and
- a second conductive layer disposed on a second surface of the encapsulant opposite to the first surface,
- wherein the plurality of conductive structures are connected to the first conductive layer and the second conductive layer.

9. The electronic device of claim 1, wherein a first part of the plurality of conductive structures defines a filter.

10. The electronic device of claim 1, wherein a second part of the plurality of conductive structures defines a divider.

11. The electronic device of claim 1, further comprising a second waveguide adjacent to a first side of the interconnection structure, wherein the first waveguide is adjacent to a second side of the interconnection structure opposite to the first side.

12. The electronic device of claim 8, wherein the first conductive layer defines a first antenna electrically coupled to the first waveguide.

13. The electronic device of claim 12,
- wherein the encapsulant is disposed on the first antenna and encapsulates the first electronic component and the second electronic component, and
- the electronic device further comprises a second antenna disposed on the encapsulant and electrically coupled to the first antenna.

14. An electronic device, comprising:
- a baseband die;
- a radio-frequency integrated chip (RFIC) beside the baseband die; and
- a bridge die below the baseband die and the RFIC, and electrically connecting a portion of output terminals of the baseband die with a portion of output terminals of the RFIC.

15. The electronic device of claim 14, further comprising an encapsulant covering the bridge die and defining a waveguide electrically connected to the RFIC.

16. An electronic device, comprising:
- a baseband chip;
- a RFIC adjacent to the baseband chip; and
- a waveguide disposed below the baseband chip and the RFIC, wherein the waveguide defines an antenna electrically connected to the RFIC, wherein the waveguide extends beyond an edge of the baseband chip and beyond an edge of the RFIC opposite to the baseband chip.

17. The electronic device of claim 16, wherein at least a portion of the baseband chip or the RFIC overlaps the waveguide.

* * * * *